(12) United States Patent
Cheng (10) Patent No.: US 10,771,023 B2
(45) Date of Patent: Sep. 8, 2020

(54) AMPLIFIER

(71) Applicant: RichWave Technology Corp., Taipei (TW)

(72) Inventor: Ting-Yuan Cheng, Taipei (TW)

(73) Assignee: RichWave Technology Corp., Taipei (TW)

( * ) Notice: Subject to any disclaimer, the term of this patent is extended or adjusted under 35 U.S.C. 154(b) by 52 days.

(21) Appl. No.: 16/134,992

(22) Filed: Sep. 19, 2018

(65) Prior Publication Data

US 2019/0334487 A1 Oct. 31, 2019

(30) Foreign Application Priority Data

Apr. 27, 2018 (TW) .............................. 107114470 A (51) Int. Cl.
| | | |
|---|---|---|
| *H03F 3/04* | (2006.01) | |
| *H03F 3/193* | (2006.01) | |
| *H03F 1/32* | (2006.01) | |
| *H03F 3/21* | (2006.01) | |
| *H03F 3/45* | (2006.01) | |
| *H03F 1/22* | (2006.01) | |

(52) U.S. Cl.
CPC .............. *H03F 3/193* (2013.01); *H03F 1/22* (2013.01); *H03F 1/223* (2013.01); *H03F 1/3205* (2013.01);
(Continued)

(58) Field of Classification Search
CPC ........ H03F 1/223; H03F 3/211; H03F 1/3205; H03F 3/19; H03F 2200/168;
(Continued)

(56) References Cited

U.S. PATENT DOCUMENTS

2005/0179500 A1 8/2005 Chang et al.
2007/0030076 A1* 2/2007 Kim ....................... H03F 1/223
330/311

(Continued)

FOREIGN PATENT DOCUMENTS

CN 203368405 12/2013
TW 200820589 5/2008

OTHER PUBLICATIONS

"Search Report of Europe Counterpart Application", dated Sep. 11, 2019, p. 1-p. 8.

(Continued)

*Primary Examiner* — Khanh V Nguyen
*Assistant Examiner* — Khiem D Nguyen
(74) *Attorney, Agent, or Firm* — JCIPRNET (57) ABSTRACT

An amplifier including a signal input terminal, at least one signal output terminal, a first and a second cascode amplifier circuits, a capacitor and a loading circuit. The signal input terminal receives an input signal. The first cascode amplifier circuit includes a first and a second input terminals and a first and a second output terminals. The first input terminal coupled to the signal input terminal receives the input signal. The second cascode amplifier circuit includes a third and a fourth input terminals and a third output terminal. The third input terminal is coupled to the first output terminal, and the third output terminal is coupled to the second input terminal. Two terminals of the capacitor are coupled to the fourth input terminal and the first output terminal respectively. A terminal of the loading circuit is coupled to the third output terminal, and another terminal of the loading circuit is coupled to the second output terminal. At least one of two terminals of the loading circuit is further coupled to the at least one signal output terminal.

11 Claims, 10 Drawing Sheets

(52) U.S. Cl.
CPC ............ *H03F 1/3211* (2013.01); *H03F 3/211* (2013.01); *H03F 3/45206* (2013.01); *H03F 2200/294* (2013.01); *H03F 2200/42* (2013.01); *H03F 2200/61* (2013.01); *H03F 2203/45024* (2013.01)

(58) Field of Classification Search
CPC ......... H03F 2200/456; H03F 2200/294; H03F 2200/492; H03F 1/22; H03F 3/193; H03F 2200/372; H03F 2200/61
USPC ................................ 330/253, 302, 311, 296
See application file for complete search history.

(56) References Cited

U.S. PATENT DOCUMENTS

2008/0246538 A1 10/2008 Beffa
2010/0148873 A1 6/2010 Li et al.
2015/0263675 A1 9/2015 Ding et al.
2017/0070197 A1 3/2017 Sivonen et al.

OTHER PUBLICATIONS

Sanfeng Zhang et al., "A 90-dB DC gain high-speed nested gain-boosted folded-cascode opamp," 2015 11th Conference on Ph.D. Research in Microelectronics and Electronics (PRIME), Jun. 2015, pp. 357-360.

Prateek Vajpayee et al., "Wide output swing inverter fed modified regulated cascode amplifier for analog and mixed-signal applications," TENCON 2009—2009 IEEE Region 10 Conference, Jan. 2009, pp. 1-5.

Yu-Lin Wang et al., "Design and Implementation of the Cascade and Cascade Low Noise Amplifiers for 13 GHz", 2011 Cross Strait Quad-Regional Radio Science and Wireless Technology Conference, Jul. 2011, pp. 625-629.

* cited by examiner

AMPLIFIER

CROSS-REFERENCE TO RELATED APPLICATION

This application claims the priority benefit of Taiwan application serial no. 107114470, filed on Apr. 27, 2018. The entirety of the above-mentioned patent application is hereby incorporated by reference herein and made a part of this specification.

BACKGROUND

Technical Field

The present disclosure relates to an amplifier, and particularly to an amplifier mainly used for wireless communication and designed with low-noise function.

Description of Related Art

An amplifier can be applied in various technical fields. In communication system, a receiver can amplify a signal received from antenna via an amplifier (e.g., low-noise amplifier (LNA)) so as for the signal to be processed by back-end stage electronic facility. Generally speaking, the signal from antenna is very weak, and thus the amplifier is disposed at a position close to the antenna to reduce the loss of signal while passing through a transmission line. Since the amplifier is disposed at the first stage of the overall receiver close to the antenna, the property of the amplifier (e.g., signal gain, noise processing, power consumption, etc.) directly affects the quality of the signal received by the overall receiver. In order to ensure the quality of the signal received by the antenna, a good amplifier should generate noise that is as low as possible while amplifying signal and reduce the signal from being distorted.

Conventional amplifier is realized as one or more differential amplifiers, and the differential amplifiers are used to improve signal gain of an output signal. However, such amplifier has larger power consumption. Additionally, since the transistors of the differential amplifiers are configured in pairs, and each of the transistors generates noise inherently, causing that the noises generated by each of the transistors in the amplifier are summed due to their opposite phases. In other words, the circuit structures of conventional amplifiers not only make it difficult for noises to be eliminated mutually, but also increases the interference of the output signal by the noises. Moreover, the signal gain in differential amplifiers is conventionally realized by the means of amplifying the gain of one of gate/source terminal in the transistors, which makes it difficult to obtain higher signal gain.

In view of the above, it is an objective for practitioners of the field to find out how to design a new amplifier with higher signal gain, more capable of processing noise while reduce signal from being distorted as much as possible.

SUMMARY

In the disclosure, an amplifier includes a first signal input terminal, at least one signal output terminal, a first cascode amplifier circuit, a second cascode amplifier circuit, a first capacitor and a loading circuit. The first signal input terminal receives a first input signal. The first cascode amplifier circuit includes a first input terminal, a second input terminal, a first output terminal and a second output terminal. The first input terminal is coupled to the first signal input terminal to receive the first input signal. The second cascode amplifier circuit includes a third input terminal, a fourth input terminal and a third output terminal. The third input terminal is coupled to the first output terminal, and the third output terminal is coupled to the second input terminal. Two terminals of the first capacitor are respectively coupled to the fourth input terminal and the first output terminal. The loading circuit includes a first terminal and a second terminal. The first terminal of the loading circuit is coupled to the third output terminal. The second terminal of the loading circuit is coupled to the second output terminal. At least one of the first terminal and the second terminal of the loading circuit is further coupled to at least one signal output terminal.

To make the foregoing features of the present disclosure clearer and more comprehensible, embodiments are described below in detail with reference to the accompanying drawings.

DESCRIPTION OF THE EMBODIMENTS

Figure 1:
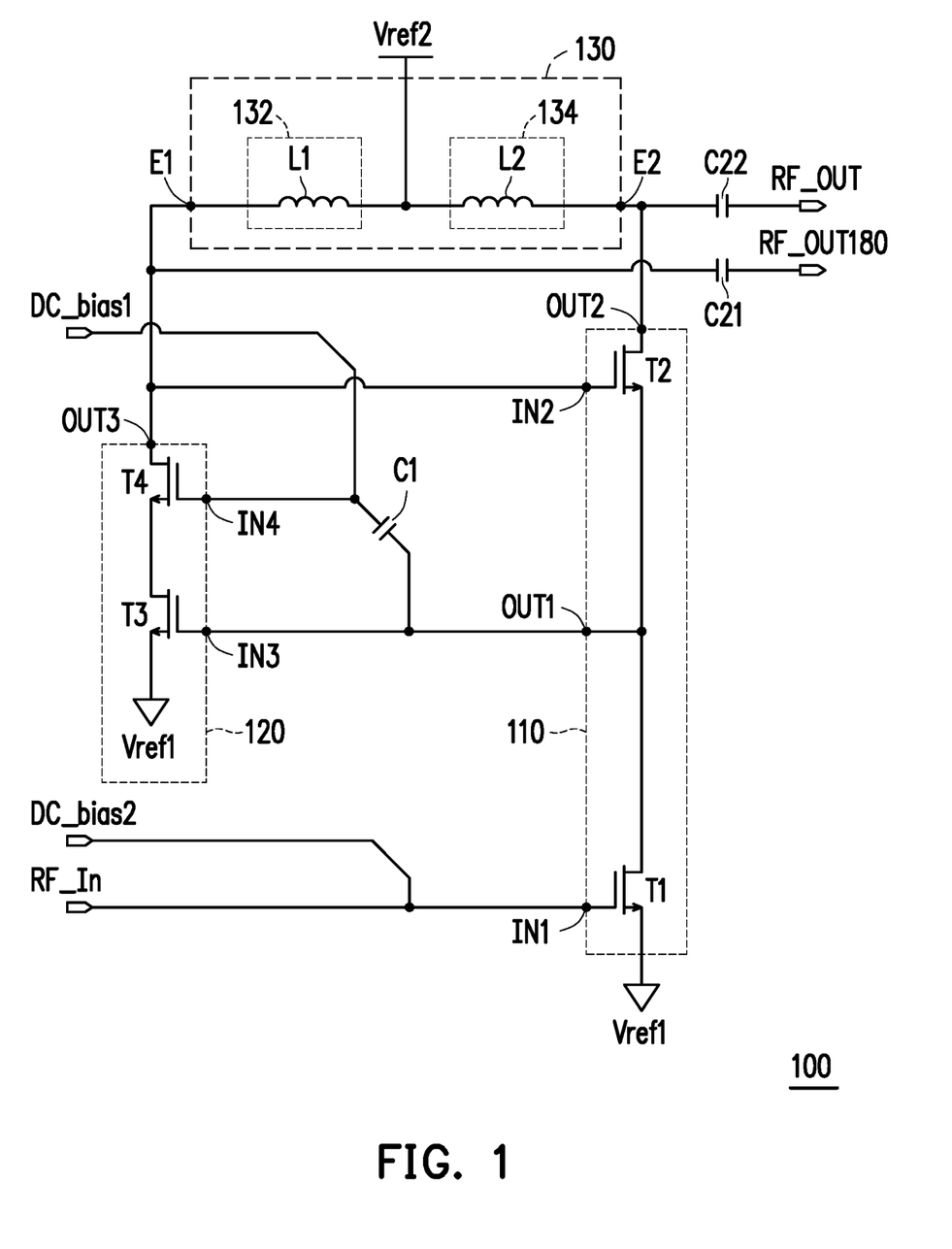
FIG. 1 is a circuit diagram of an amplifier 100 according to a first embodiment of the disclosure.

FIG. 1 is a circuit diagram of an amplifier 100 according to a first embodiment of the disclosure. The amplifier 100 may be a LNA used in a receiver for wireless communication. Those who adopt the present embodiment may apply the amplifier 100 to other electronic facilities or a signal amplifying facility of other technical fields, the disclosure provides no limitation to the application field of the amplifier 100. The amplifier 100 in FIG. 1 belongs to a single-ended input, double-ended output amplifier. The double-ended output amplifier in the embodiment may be referred to as a differential output amplifier.

The amplifier 100 includes a signal input terminal RF_In, at least one signal output terminal (e.g., signal output terminal RF_OUT, RF_OUT180), a cascode amplifier circuit 110, a cascode amplifier circuit 120, a capacitor C1 and a loading circuit 130. The signal input terminal RF_In receives a first input signal (e.g., radio-frequency (RF) signal). The "cascode amplifier circuit" is an amplifier circuit structure that is formed by stacking two or more transistors, which makes it possible to obtain a better signal gain and improves frequency response.

The cascode amplifier circuit 110 includes an input terminal IN1, an input terminal IN2, an output terminal OUT1 and an output terminal OUT2. The input terminal IN1 is coupled to the signal input terminal RF_In to receive the first input signal. The cascode amplifier circuit 120 includes an input terminal IN3, an input terminal IN4 and an output terminal OUT3. Additionally, the input terminal IN1 may be further coupled to a bias terminal DC_bias2 to supply a stable direct current (DC) bias voltage to the input terminal IN1.

The input terminal IN3 is coupled to the output terminal OUT1. The output terminal OUT3 is coupled to the input terminal IN2. Additionally, the input terminal IN4 may be further coupled to a bias terminal DC_bias1 to supply a stable DC bias voltage to the input terminal IN4. In the embodiment, the DC bias voltage on the bias terminal DC_bias1 is greater than the DC bias voltage on the bias terminal DC_bias2. Those who adopt the present embodiment may adjust the DC bias voltage on the bias terminals DC_bias1 and DC_bias2 depending on the need, for example, by adjusting the DC bias voltage on the bias terminal DC_bias1 to be less than or equal to the DC bias voltage on the bias terminal DC_bias2.

Two terminals of the capacitor C1 are respectively coupled to the input terminal IN4 and the output terminal OUT1. The capacitor C1 is used for performing alternating current (AC) coupling effect. The capacitor C1 of the embodiment, a capacitor C21 and/or a capacitor C22 in the following embodiment may include one of a junction capacitor, a metal-insulator-metal (MIM) capacitor, a metal-oxide-metal (MOM) capacitor and a transistor capacitor or a combination thereof.

The loading circuit 130 includes a first terminal E1 and a second terminal E2. The first terminal E1 is coupled to the output terminal OUT3. The second terminal E2 is coupled to the output terminal OUT2.

One of the first terminal E1 and the second terminal E2 of the loading circuit 130 is further coupled to at least one signal output terminal. Specifically, the amplifier 100 of the embodiment is a double-ended output amplifier. Therefore, the first terminal E1 is coupled to the signal output terminal RF_OUT180 via the capacitor C21, the second terminal E2 is coupled to the signal output terminal RF_OUT via the capacitor C22. In other words, the amplifier 100 further includes at least two capacitors C21 and C22. Two terminals of the capacitor C21 are respectively coupled to the first terminal E1 and the signal output terminal RF_OUT180, and two terminals of the capacitor C22 are respectively coupled to the second terminal E2 and the signal output terminal RF_OUT. The capacitors C21 and C22 are mainly used for blocking the DC signal being output from the signal output terminals RF_OUT180 and RF_OUT to a back-end electronic facility, that is, also referred to as DC blocking. The signal on the signal output terminal RF_OUT180 and the signal on the signal output terminal RF_OUT are differential to each other.

The circuit structure of the cascode amplifier circuit 110 is described in details below. The cascode amplifier circuit 110 mainly includes a transistor T1 and a transistor T2. Transistors T1 and T2 in FIG. 1 as well as transistors T3-T8 and TL1-TL2 described below may include one of a bipolar junction transistor (BJT), a complementary metal-oxide-semiconductor (CMOS) transistor or a field-effect transistor (FET) or a combination thereof. The transistors T1-T8 as well as transistors TL1 and TL2 in the embodiment and the following embodiments are realized as N-type transistor. Those who adopt the present embodiment may realize each of the transistors as P-type transistor. Additionally, the first terminal of the N-type transistor in the embodiment is a source terminal, the second terminal of the N-type transistor is a drain terminal, and the control terminal of the N-type transistor is a gate terminal; similar descriptions are omitted in the following embodiment. The control terminal of the transistor T1 is coupled to the input terminal IN1. The first terminal of the transistor T1 receives a reference voltage Vref1. The second terminal of the transistor T1 is coupled to the output terminal OUT1. The control terminal of the transistor T2 is coupled to the input terminal IN2. The first terminal of the transistor T2 is coupled to the second terminal of the transistor T1. The second terminal of the transistor T2 is coupled to the output terminal OUT2.

The circuit structure of the cascode amplifier circuit 120 is described in details below. The cascode amplifier circuit 120 includes a transistor T3 and a transistor T4. The control terminal of the transistor T3 is coupled to the input terminal IN3. The first terminal of the transistor T3 receives the reference voltage Vref1. The control terminal of the transistor T4 is coupled to the input terminal IN4, the first terminal of the transistor T4 is coupled to the second terminal of the transistor T3, and the second terminal of the transistor T4 is coupled to the output terminal OUT3.

The circuit structure of the loading circuit 130 is described below. The loading circuit 130 in the embodiment may mainly include loading elements 132 and 134. The first terminal of the loading element 132 is coupled to the first terminal E1 of the loading circuit 130. The first terminal of the loading element 134 is coupled to the second terminal of the loading element 132, the second terminal of the loading element 134 is coupled to the second terminal E2 of the loading circuit 130. The second terminal of the loading element 132 and the first terminal of the loading element 134 receive a reference voltage Vref2. It should be specifically indicated that, when the embodiment of the disclosure realizes each of the transistors as the N-type transistor, the reference voltage Vref1 is exemplified as a ground voltage, and the reference voltage Vref2 is exemplified as a power voltage.

The loading elements 132 and 134 in FIG. 1 respectively include inductors L1 and L2. In other embodiments, the loading element 132 and/or the loading element 134 may be realized as one of the inductor, resistor and transistor or a combination thereof, and examples are provided in the embodiments below as well as the drawings.

With the circuit structure shown in FIG. 1, it is possible that the noise on the two signal output terminals RF_OUT and RF_OUT180 of the amplifier 100 generated by the noise with the transistors T1, T2, T3 or T4 has the same phase with the noise, such that the two noises are mutually eliminated and reduced because they have the same phase; in this manner, the signal on the signal output terminals RF_OUT and RF_OUT180 are not easily affected by the noise generated by the transistor.

In the amplifier circuit structure realized through conventional means, the signal gain in the differential amplifier is realized by the means of amplifying the gain of one of gate/source terminal in the transistor. Relatively, the amplifier 100 in the embodiment amplifies the signal gain of the AC RF signal received by the signal input terminal RF_In mainly through the transistors T1 and T2 in the cascode amplifier circuit 110, and inputs the signal related to the RF signal to the gate terminal of the transistors T3 and T4 in the cascode amplifier circuit 120, such that the cascode amplifier circuit 120 feedbacks the signal to the input terminal IN2 of the cascode amplifier circuit 110. By using the circuit structure in the embodiment, the source terminal and the gate terminal of the transistor T2 respectively receive the signal related to the RF signal, so as to increase the strength of signal gain of the amplifier 100 for the RF signal. In other words, the signal gain of the amplifier 100 in FIG. 1 is greater than the signal gain of the amplifier structure realized as conventional differential amplifier. Additionally, the circuit structure that mainly consumes power in the amplifier 100 is the cascode amplifier circuit 110. The cascode amplifier circuit 120 is mainly used to assist the cascode amplifier circuit 110 for consuming less power. Accordingly, the power consumed in the amplifier 100 is less than that consumed in the amplifier structure realized as conventional differential amplifier.

In FIG. 1, the signal gain Gain of the cascode amplifier circuit 110 in the amplifier 100 may be represented by the equation (1) below:

$$\text{Gain} = \frac{-gm1 \times Zl \times (1 + gm2)}{1 - gm1 \times s \times M12} \tag{1}$$

In equation (1), the symbol "gm1" refers to gain of transistor T1; symbol "gm2" refers to gain of transistor T2; symbol "Zl" refers to RLC resonant impedance of the signal output terminal in the amplifier 100; symbol "s" refers to complex frequency of Laplace transform; symbol "M12" refers to mutual inductance value between the inductors L1 and L2 in the loading circuit 130.

Figure 2:
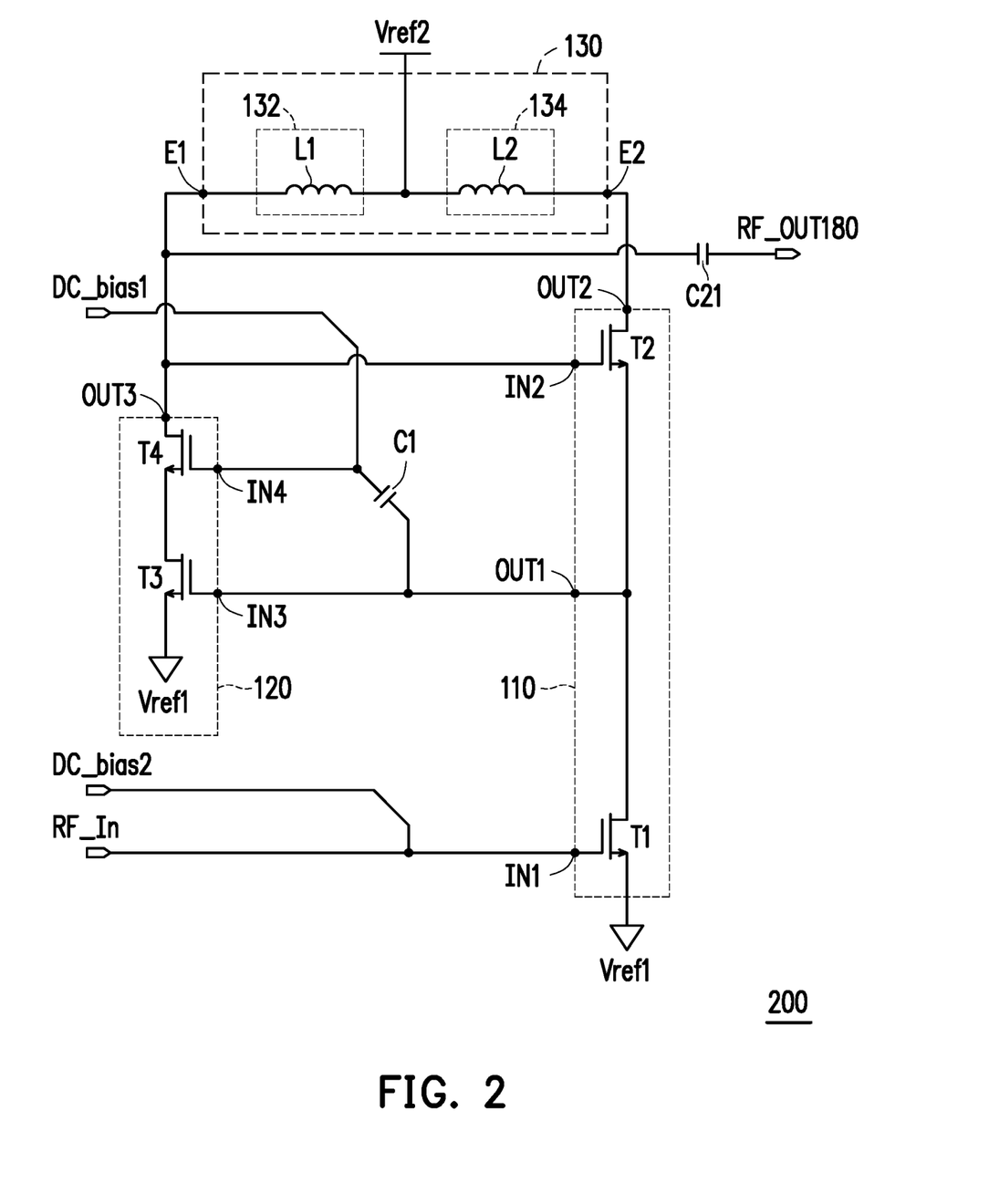
FIG. 2 is a circuit diagram of an amplifier 200 according to a second embodiment of the disclosure.

FIG. 2 is a circuit diagram of an amplifier 200 according to a second embodiment of the disclosure. The difference between the amplifier 200 in FIG. 2 and the amplifier 100 in FIG. 1 is that the amplifier 200 in FIG. 2 is a single-ended output amplifier. The amplifier 200 only has one signal output terminal RF_OUT180. The signal output terminal RF_OUT180 is coupled to the first terminal E1 of the loading circuit 130 via the capacitor C21. Those who adopt the present embodiment may change the amplifier circuit structure in the embodiment into a single-ended output amplifier by reference the example in FIG. 2 according to their needs.

Figure 3:
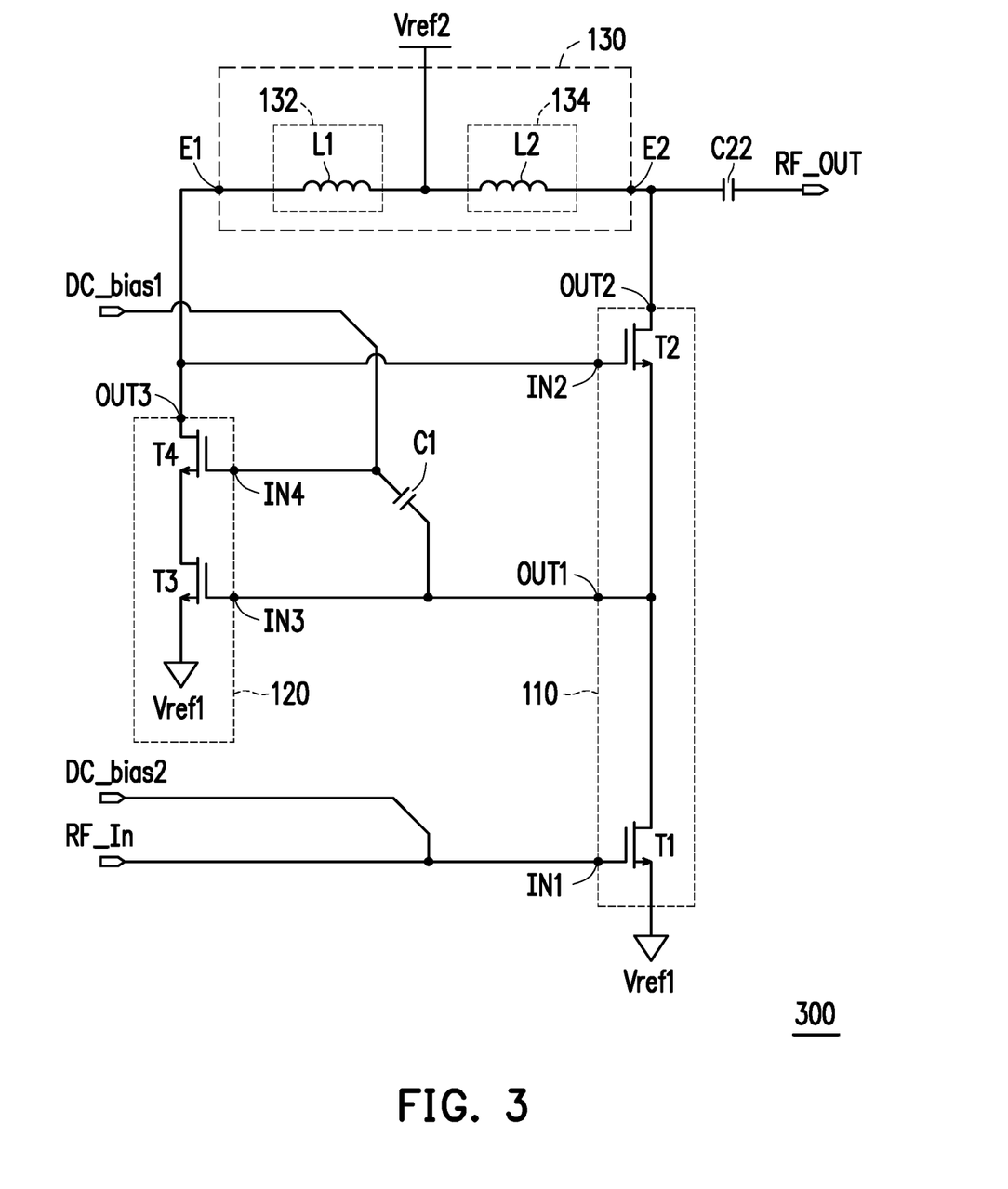
FIG. 3 is a circuit diagram of an amplifier 300 according to a third embodiment of the disclosure.

FIG. 3 is a circuit diagram of an amplifier 300 according to a third embodiment of the disclosure. The difference between the amplifier 300 in FIG. 3 and the amplifier 100 in FIG. 1 is that the amplifier 300 in FIG. 3 is a single-ended output amplifier. The amplifier 300 only has one signal output terminal RF_OUT. The signal output terminal RF_OUT is coupled to the second terminal E2 of the loading circuit 130 via the capacitor C22. Those who adopt the present embodiment may change the amplifier circuit structure in the embodiment into a single-ended output amplifier by reference the example in FIG. 3 according to their needs.

FIG. 4A-FIG. 4E are circuit structure diagrams of different types of loading circuits 430A-430E in different embodiments of the disclosure. The main difference between loading circuits 430A-430E in FIG. 4A-FIG. 4E and the loading circuit 130 in FIG. 1 is that their circuit structures are different. Those who adopt the present embodiment may selectively apply the circuit structure of one of the loading circuits 130, 430A-430E to the circuit structure of each of the amplifiers in the embodiment depending on the need.

Figure 4A:
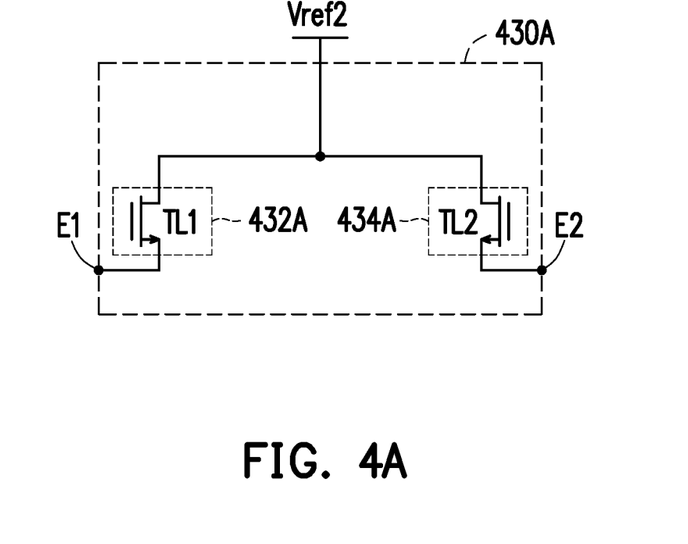
FIGS. 4A, 4B, 4C, 4D, and 4E are circuit structure diagrams of different types of loading circuits in different embodiments of the disclosure.

The circuit structure of the loading circuits 430A-430E are described below. In FIG. 4A, loading elements 432A and 434A of the loading circuit 430A respectively include a transistor TL1 and a transistor TL2. The first terminal of the transistor TL1 is coupled to the first terminal E1 of the loading circuit 430A, the second terminal of the transistor TL1 is coupled to the second terminal of the transistor TL2 and the reference voltage Vref2, and the first terminal of the transistor TL2 is coupled to the second terminal E2 of the loading circuit 430A.

Figure 4B:
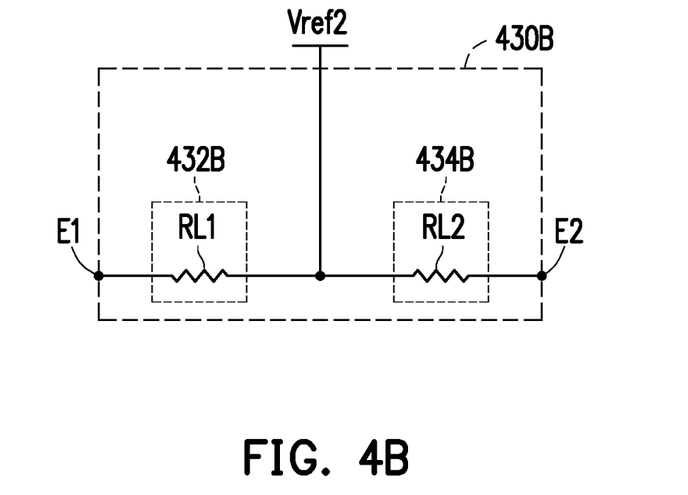

In FIG. 4B, loading elements 432B and 434B of the loading circuit 430B respectively include resistors RL1 and RL2. The first terminal of the resistor RL1 is coupled to the first terminal E1 of the loading circuit 430B. The second terminal of the resistor RL1 is coupled to the reference voltage Vref2. The first terminal of the resistor RL2 is coupled to the reference voltage Vref2, the second terminal of the resistor RL2 is coupled to the second terminal E2 of the loading circuit 430B.

Figure 4C:
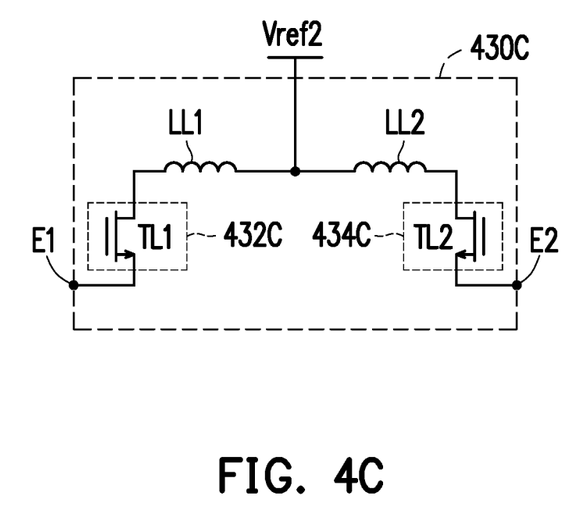

In FIG. 4C, when loading elements 432C and 434C of the loading circuit 430C are realized as the transistors TL1 and TL2, the loading circuit 430C may further include loading inductors LL1 and LL2. The first terminal of the loading inductor LL1 is coupled to the second terminal of the transistor TL1, and the second terminal of the loading inductor LL1 is coupled to the reference voltage Vref2. The first terminal of the loading inductor LL2 is coupled to the reference voltage Vref2, and the second terminal of the loading inductor LL2 is coupled to the second terminal of the transistor TL2. The second terminal of the transistors TL1 and TL2 receive the reference voltage Vref2 via the loading inductors LL1 and LL2 respectively.

Figure 4D:
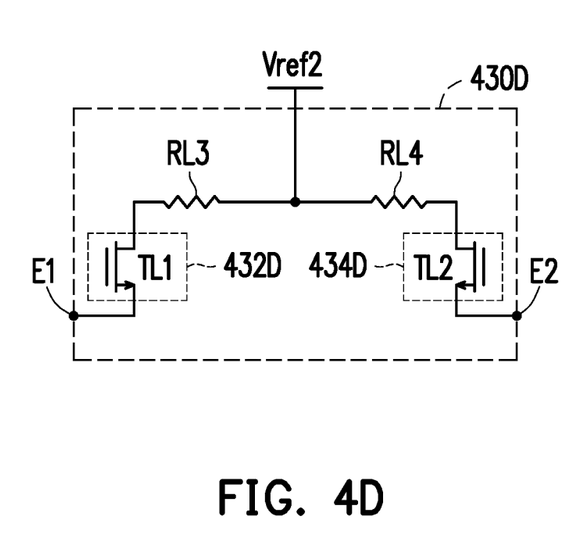

In FIG. 4D, when loading elements 432D and 434D of the loading circuit 430D are realized as the transistors TL1 and TL2, the loading circuit 430D may further include loading resistors RL3 and RL4. The first terminal of the loading resistor RL3 is coupled to the second terminal of the transistor TL1, and the second terminal of the loading resistor RL3 is coupled to the reference voltage Vref2. The first terminal of the loading resistor RL4 is coupled to the reference voltage Vref2, and the second terminal of the loading resistor RL4 is coupled to the second terminal of the transistor TL2. The second terminal of the transistors TL1 and TL2 receive the reference voltage Vref2 via the loading resistors RL3 and RL4 respectively.

Figure 4E:
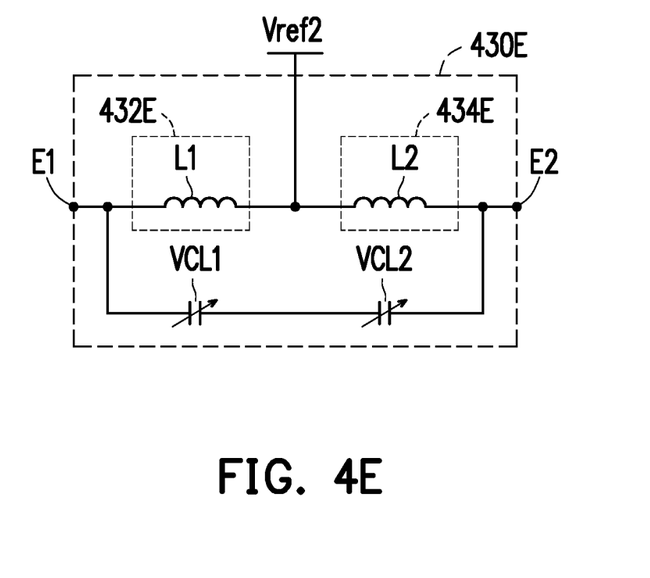

In FIG. 4E, the loading circuit 430E may further include two variable capacitors VCL1 and VCL2 other than two loading elements 432E and 434E. Specifically, the first terminal of the variable capacitor VCL1 is coupled to the first terminal E1 of the loading circuit 430E. The first terminal of the variable capacitor VCL2 is coupled to the second terminal of the variable capacitor VCL1, and the second terminal of the variable capacitor VCL2 is coupled to the second terminal E2 of the loading circuit 430E. Those who adopt the present embodiment may apply the circuit structure of the loading elements 432A-432B and 434A-434B in FIG. 4A-FIG. 4B to the circuit structure of the loading elements 432E and 434E in the present embodiment.

Figure 5:
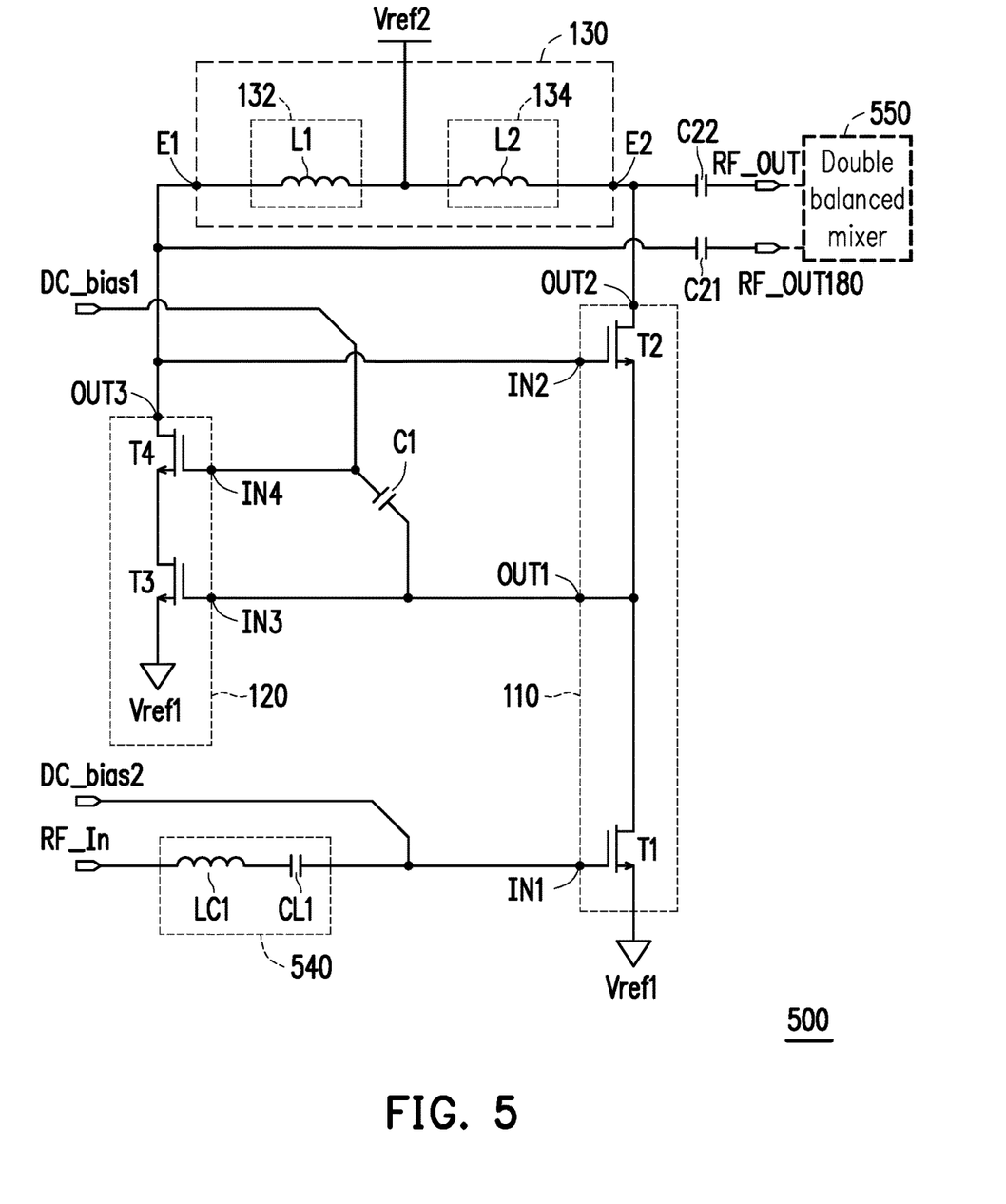
FIG. 5 is a circuit diagram of an amplifier 500 according to a fourth embodiment of the disclosure.

FIG. 5 is a circuit diagram of an amplifier 500 according to a fourth embodiment of the disclosure. The difference between the amplifier 500 in FIG. 5 and the amplifier 100 in FIG. 1 is that the amplifier 500 in FIG. 5 further includes a matching circuit 540, and the two signal output terminals RF_OUT and RF_OUT180 of the amplifier 500 may be connected to a double balanced mixer 550 outside the amplifier 500. Specifically, the matching circuit 540 includes an inductor LC1 and a capacitor CL1. One terminal of the inductor LC1 is coupled to the signal input terminal RF_In, and the other terminal of the inductor LC1 is coupled to one terminal of the capacitor CL1. The other terminal of the capacitor CL1 is coupled to the input terminal IN1 of the cascode amplifier circuit 110. The function of the matching circuit 540 is to eliminate the DC bias voltage on the signal input terminal RF_In, and also serves to adjust the matching of input impedance. The matching circuit 540 may also be applied to all amplifier structures in the embodiment of the disclosure.

The amplifier 500 in FIG. 5 is a double-ended output/differential output amplifier. Two terminals of the capacitor C21 is coupled to the first terminal E1 of the loading circuit 130 and one of the signal output terminals RF_OUT and RF_OUT180 of the amplifier 500. Two terminals of the capacitor C22 is coupled to the second terminal E2 of the loading circuit 130 and the other one of the signal output terminals RF_OUT and RF_OUT180 of the amplifier 500. In order to make the two signals on the signal output terminals RF_OUT and RF_OUT180 to be mutually adjusted and achieve balance of output amplitude, the two signal output terminals RF_OUT and RF_OUT180 of the amplifier 500 may be connected to the double balanced mixer 550 outside the amplifier 500. The double balanced mixer 550 is capable of balancing the output amplitude of the two signals on the signal output terminals RF_OUT and RF_OUT180. Since the double balanced mixer 550 is not disposed within the amplifier 500 but outside the amplifier 500, the double balanced mixer 550 is shown as a square frame illustrated in dashed line.

Figure 6:
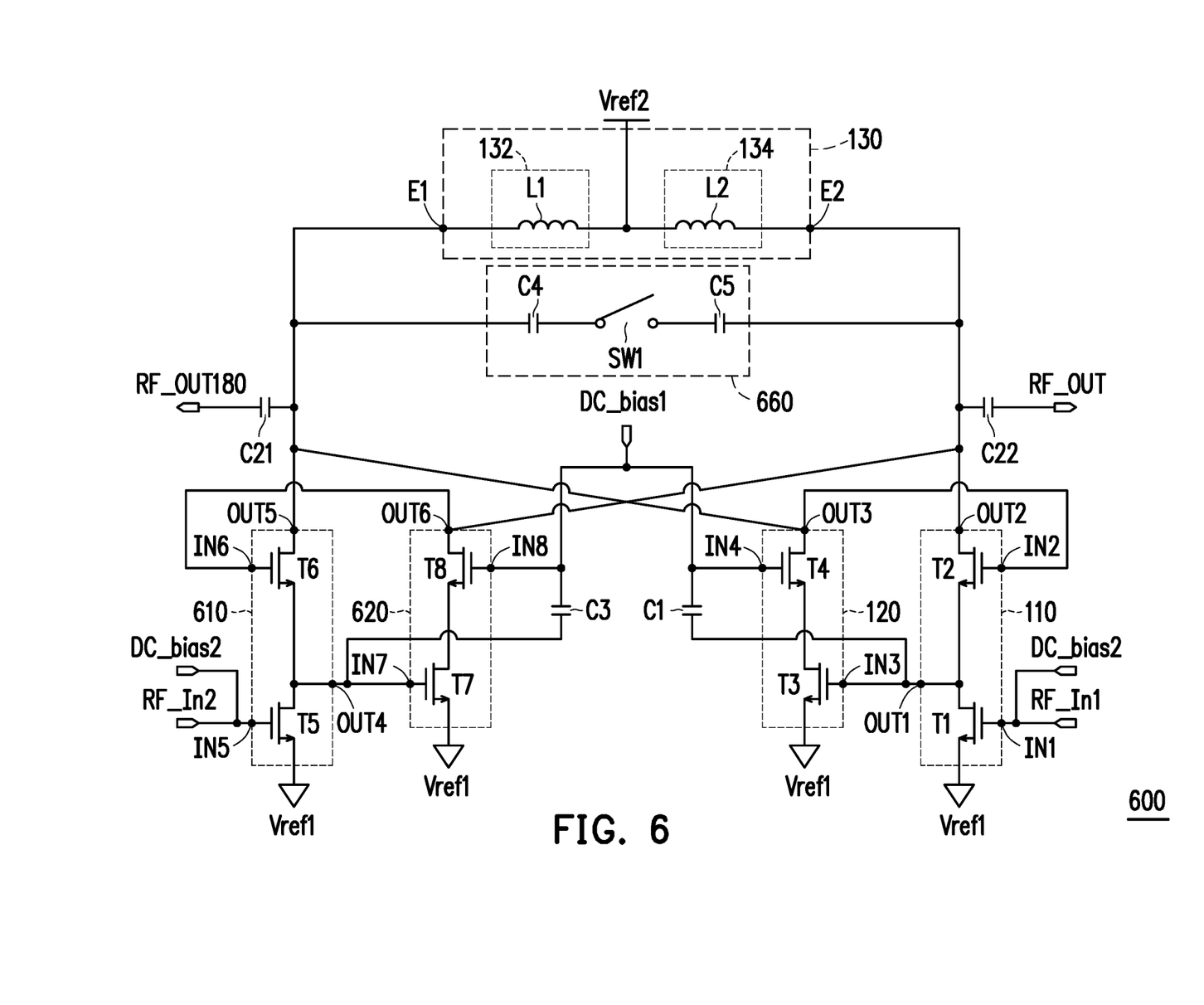
FIG. 6 is a circuit diagram of an amplifier 600 according to a fifth embodiment of the disclosure.

FIG. 6 is a circuit diagram of an amplifier 600 according to a fifth embodiment of the disclosure. The amplifier 600 is a double-ended input and double-ended output amplifier. Other than the original configuration (i.e., signal input terminal RF_In1, signal output terminal RF_OUT, RF_OUT180, cascode amplifier circuit 110, cascode amplifier circuit 120, capacitor C1 and loading circuit 130) of the amplifier 100 shown in FIG. 1, the amplifier 600 further includes a signal input terminal RF_In2, a cascode amplifier circuit 610, a cascode amplifier circuit 620 and a capacitor C3. The signal input terminal RF_In2 receives a second input signal (e.g., RF signal). The first input signal received by the signal input terminal RF_In1 and the second input signal received by the signal input terminal RF_In2 are differential to each other.

The cascode amplifier circuit 610 includes an input terminal IN5, an input terminal IN6, an output terminal OUT4 and an output terminal OUT5. The input terminal IN5 is coupled to the signal input terminal RF_In2 to receive the second input signal, and the output terminal OUT5 is coupled to the first terminal E1 of the loading circuit 130. The input terminal IN1 and the input terminal IN5 may be further coupled to the bias terminal DC_bias2 to supply stable DC bias voltage to the input terminals IN1 and IN5.

Specifically, the cascode amplifier circuit 610 includes a transistor T5 and a transistor T6. The control terminal of the transistor T5 is coupled to the input terminal IN5. The first terminal of the transistor T5 receives the reference voltage Vref1. The second terminal of the transistor T5 is coupled to the output terminal OUT4. The control terminal of the transistor T6 is coupled to the input terminal IN6. The first terminal of the transistor T6 is coupled to the second terminal of the transistor T5. The second terminal of the transistor T6 is coupled to the output terminal OUT5.

The cascode amplifier circuit 620 includes an input terminal IN7, an input terminal IN8 and an output terminal OUT6. The input terminal IN7 is coupled to the output terminal OUT4. The output terminal OUT6 is coupled to the input terminal IN6 and the second terminal E2 of the loading circuit 130. Specifically, the cascode amplifier circuit 620 includes a transistor T7 and a transistor T8. The control terminal of the transistor T7 is coupled to the input terminal IN7, and the first terminal of the transistor T7 receives the reference voltage Vref1. The control terminal of the transistor T8 is coupled to the input terminal IN8. The first terminal of the transistor T8 is coupled to the second terminal of the transistor T7, and the second terminal of the transistor T8 is coupled to the output terminal OUT6. Two terminals of the capacitor C3 are respectively coupled to the input terminal IN8 and the output terminal OUT4.

The amplifier 600 further includes a frequency band adjusting circuit 660. The first terminal and the second terminal of the frequency band adjusting circuit 660 are respectively coupled to the first terminal E1 and the second terminal E2 of the loading circuit 130. Specifically, the frequency band adjusting circuit 660 includes a capacitor C4, a switch SW1 and a capacitor C5. The first terminal of the capacitor C4 is coupled to the first terminal E1 of the loading circuit 130. The first terminal of the switch SW1 is coupled to the second terminal of the capacitor C4. The first terminal of the capacitor C5 is coupled to the second terminal of the switch SW1. The second terminal of the capacitor C5 is coupled to the second terminal E2 of the loading circuit 130. In this manner, the central frequency of the amplifier 600 can be adjusted through the on/off state of the switch SW1 in the frequency band adjusting circuit 660.

In the embodiment, the amplifier 600 is a double-ended input, double-ended output amplifier, and may be adjusted as a double-ended input, single-ended output amplifier (e.g., when the amplifier only includes one of signal output terminal RF_OUT or RF_OUT180) according to the need of those who adopt the present embodiment. When the amplifier 600 is a double-ended output amplifier, the signal output terminals RF_OUT and RF_OUT180 may be coupled to the double-balanced mixer outside the amplifier 600 to balance the output amplitude of the two signals on the signal output terminals RF_OUT and RF_OUT180.

Figure 7:
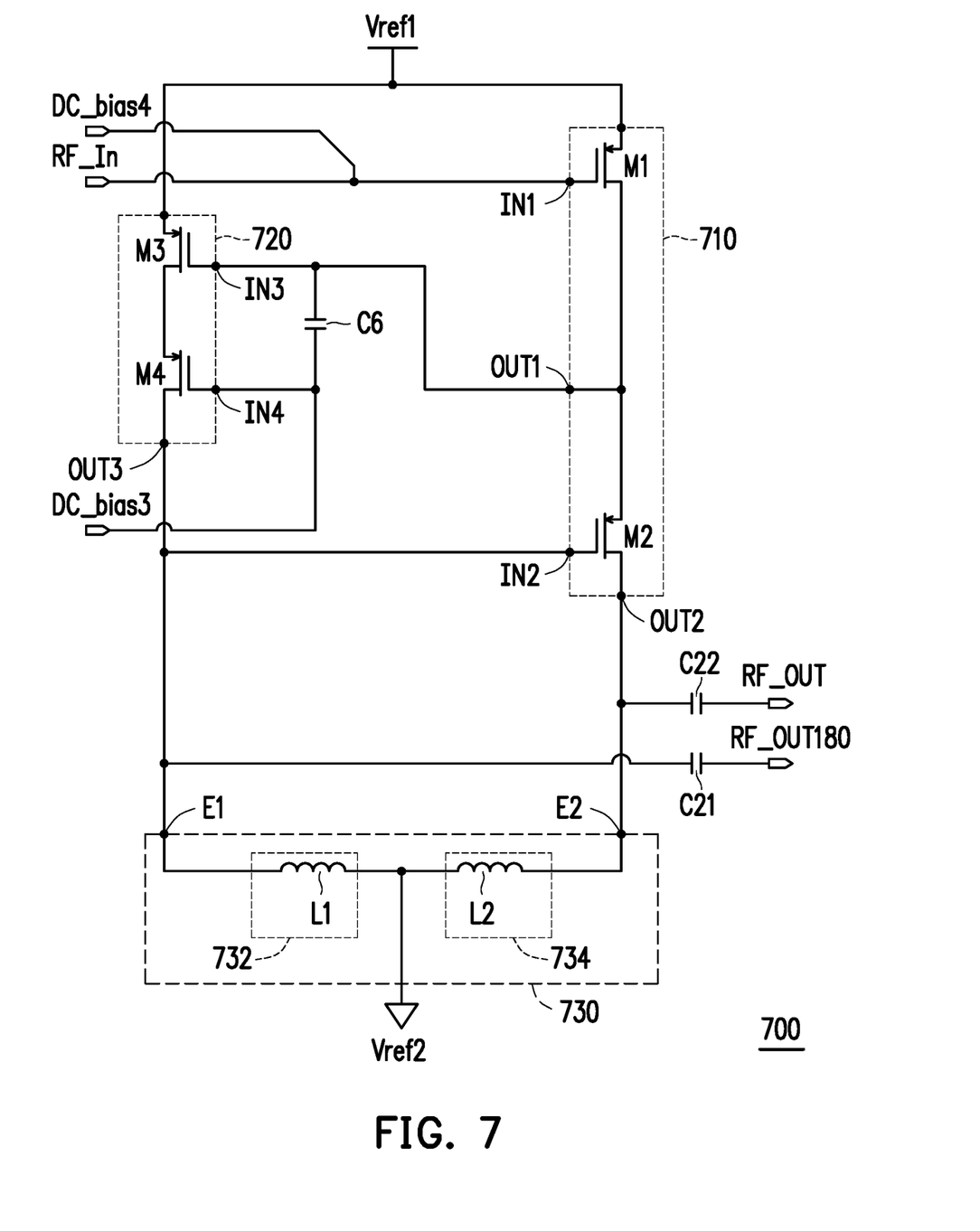
FIG. 7 is a circuit diagram of an amplifier 700 according to a sixth embodiment of the disclosure.

The transistors shown in FIG. 1-FIG. 6 are realized as a plurality of N-type transistors. In order to make the embodiment of the disclosure to be clearer, a P-type transistor is used herein to realize the amplifier that complies with the disclosure. FIG. 7 is a circuit diagram of an amplifier 700 according to a sixth embodiment of the disclosure. The amplifier 700 belongs to a single-ended input, double-ended output amplifier.

The amplifier 700 includes a signal input terminal RF_In, at least one signal output terminal (e.g., signal output terminals RF_OUT, RF_OUT180), a cascode amplifier circuit 710, a cascode amplifier circuit 720, a capacitor C6 and a loading circuit 730. The signal input terminal RF_In receives a first input signal. The cascode amplifier circuit 710 mainly includes transistors M1 and M2. The cascode amplifier circuit 720 mainly includes transistors M3 and M4. The transistors M1-M4 of the embodiment are P-type transistors. Additionally, the first terminal of the P-type transistor in the embodiment is a source terminal, the second terminal of the P-type transistor is a drain terminal, and the control terminal of the P-type transistor is a gate terminal. The connection relationship of the transistors T1-T4 of the amplifier 100 in FIG. 1 is similar to the connection relationship of the transistors M1-M4 of the amplifier 700 in FIG. 7; the difference between the two is that the reference voltage Vref1 coupled to the transistors M1 and M3 of the amplifier 700 in FIG. 7 is exemplified as power voltage, and the reference voltage Vref2 coupled to a loading circuit 730 of the amplifier 700 in FIG. 7 is exemplified as ground voltage.

The cascode amplifier circuit 710 includes an input terminal IN1, an input terminal IN2, an output terminal OUT1 and an output terminal OUT2. The input terminal IN1 is coupled to the signal input terminal RF_In to receive the first input signal. The cascode amplifier circuit 720 includes an input terminal IN3, an input terminal IN4 and an output terminal OUT3. Additionally, the input terminal IN1 may be further be coupled to a bias terminal DC_bias4 to supply stable DC bias voltage to the input terminal IN1.

The input terminal IN3 is coupled to the output terminal OUT1. The output terminal OUT3 is coupled to the input terminal IN2. Additionally, the input terminal IN4 may be further coupled to a bias terminal DC_bias3 to supply stable DC bias voltage to the input terminal IN4. In the embodiment, the DC bias voltage on the bias terminal DC_bias4 is greater than the DC bias voltage on the bias terminal DC_bias3. Those who adopt the present embodiment may adjust the DC bias voltage on the bias terminals DC_bias3 and DC_bias4 depending on the need, for example, by adjusting the DC bias voltage on the bias terminal DC_bias4 to be less than or equal to the DC bias voltage on the bias terminal DC_bias3. The loading circuit 730 includes loading elements 732 and 734, and the loading circuit 730 may be realized similarly as various aspects of the loading circuits shown in FIG. 1-FIG. 4E. The circuit structure and the function of the amplifier 700 in FIG. 7 are similar to the amplifier 100 in FIG. 1; and thus related descriptions are omitted hereinafter.

Figure 8A:
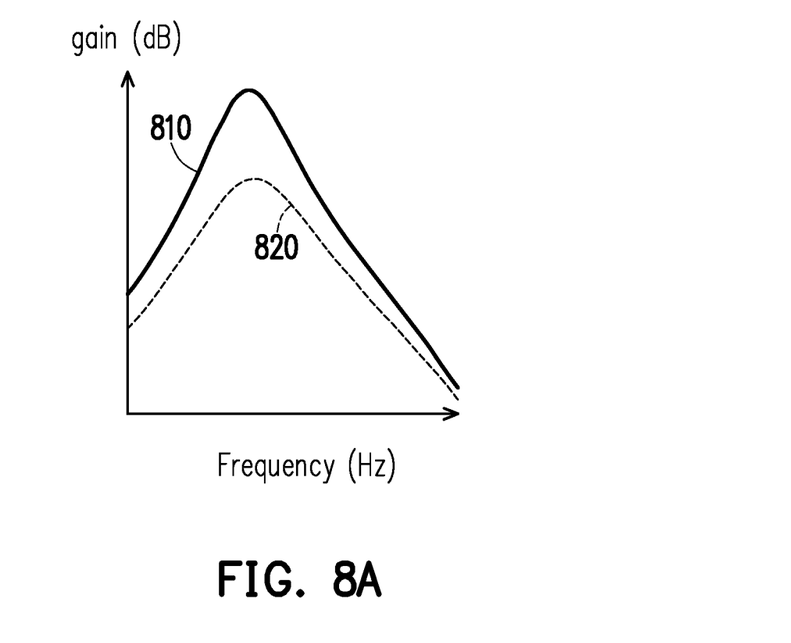
FIG. 8A and FIG. 8B are schematic views of comparison between the amplifier 100 in FIG. 1 and a conventional amplifier.
Figure 8B:
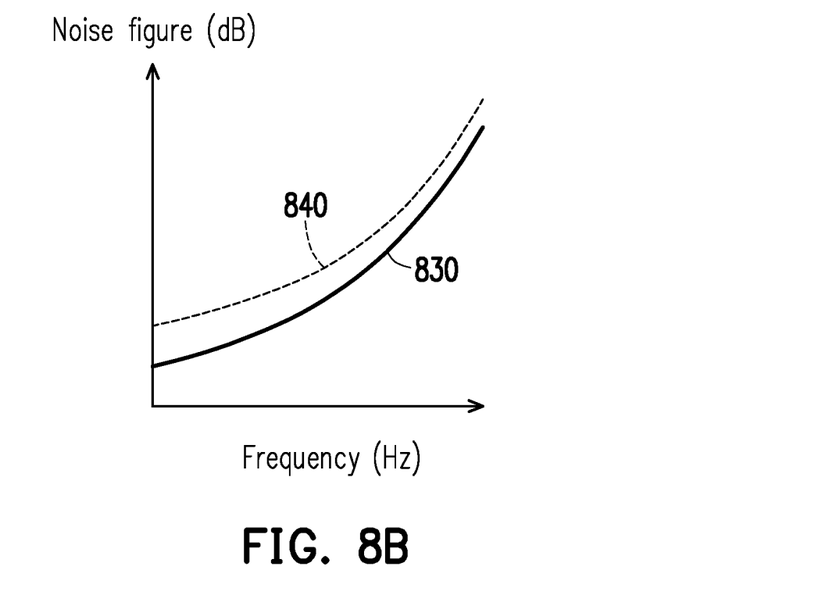

FIG. 8A and FIG. 8B are schematic views of comparison between the amplifier 100 in FIG. 1 and the conventional amplifier. FIG. 8A shows comparisons between signal gains of the amplifier 100 in FIG. 1 and conventional amplifier realized as differential amplifier. A curve 810 in FIG. 8A represents signal gain under the frequency of different input signals of the amplifier 100 in FIG. 1; a curve 820 represents signal gain under the frequency of different input signals of a conventional amplifier. FIG. 8A shows that, under the frequency of each of the input signals, the amplifier 100 in FIG. 1 achieves better signal gain as compared with conventional amplifier.

FIG. 8B shows comparisons of noise figures (NF) between the amplifier 100 in FIG. 1 and the conventional amplifier. Higher noise figure represents that the amplifier has more noise under the input signal of relative frequency (i.e., less capable of eliminating noise); lower noise figure represents that the amplifier has less noise under the input signal of relative frequency (i.e., more capable of eliminating noise). A curve 830 in FIG. 8B represents the noise figure under the frequency of different input signal of the amplifier 100 in FIG. 1. A curve 840 represents the noise figure under the frequency of different input signal of conventional amplifier. FIG. 8B shows that, under the frequency of each of the input signals, the amplifier 100 in FIG. 1 has better noise processing capability than conventional amplifier, and improves noise eliminating effect.

In summary, the amplifier of the disclosure uses two sets of cascode amplifier circuits as a single-ended amplifier to increase signal gain, such that the amplifier has good noise processing capability and reduces the signal from being distorted, e.g., eliminating noise generated by transistor, using the structure of cascode amplifier to increase signal gain. Additionally, it is possible to combine two single-ended input amplifiers to form a differential input/double-ended input amplifier to broaden the application range of the amplifier of the disclosure.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. An amplifier, comprising:
   a first signal input terminal, receiving a first input signal;
   at least one signal output terminal;
   a first cascode amplifier circuit, comprising a first input terminal, a second input terminal, a first output terminal and a second output terminal, wherein the first input terminal is coupled to the first signal input terminal to receive the first input signal;
   a second cascode amplifier circuit, comprising a third input terminal, a fourth input terminal and a third output terminal, wherein the third input terminal is coupled to the first output terminal, and the third output terminal is coupled to the second input terminal;
   a first capacitor, wherein two terminals of the first capacitor are respectively coupled to the fourth input terminal and the first output terminal; and
   a loading circuit, comprising a first terminal and a second terminal, wherein the first terminal of the loading circuit is coupled to the third output terminal, the second terminal of the loading circuit is coupled to the second output terminal, and at least one of the first terminal and the second terminal of the loading circuit is further coupled to the at least one signal output terminal.

2. The amplifier as claimed in claim 1, wherein the first cascode amplifier circuit comprises:
   a first transistor, wherein a control terminal of the first transistor is coupled to the first input terminal, a first terminal of the first transistor receives a first reference voltage, and a second terminal of the first transistor is coupled to the first output terminal; and
   a second transistor, wherein a control terminal of the second transistor is coupled to the second input terminal, a first terminal of the second transistor is coupled to the second terminal of the first transistor, and a second terminal of the second transistor is coupled to the second output terminal.

3. The amplifier as claimed in claim 1, wherein the second cascode amplifier circuit comprises:
   a third transistor, wherein a control terminal of the third transistor is coupled to the third input terminal, and a first terminal of the third transistor receives a first reference voltage; and
   a fourth transistor, wherein a control terminal of the fourth transistor is coupled to the fourth input terminal, a first terminal of the fourth transistor is coupled to a second terminal of the third transistor, and a second terminal of the fourth transistor is coupled to the third output terminal.

4. The amplifier as claimed in claim 1, wherein the loading circuit comprises:
   a first loading element, wherein a first terminal thereof is coupled to the first terminal of the loading circuit; and
   a second loading element, wherein a first terminal thereof is coupled to a second terminal of the first loading element, a second terminal of the second loading element is coupled to the second terminal of the loading circuit, and the second terminal of the first loading element and the first terminal of the second loading element receive a second reference voltage.

5. The amplifier as claimed in claim 4, wherein the first loading element comprises a first inductor, a first resistor or a fifth transistor; the second loading element comprises a second inductor, a second resistor or a sixth transistor.

6. The amplifier as claimed in claim 1, wherein the first terminal of the loading circuit is coupled to one of the at least one signal output terminal, the second terminal of the loading circuit is coupled to the other one of the at least one signal output terminal, one of the at least one signal output terminal and the other one of the at least one signal output terminal are further coupled to a double balanced mixer.

7. The amplifier as claimed in claim 1, further comprising:
a second signal input terminal, receiving a second input signal, wherein the first input signal and the second input signal are differential to each other;
a third cascode amplifier circuit, comprising a fifth input terminal, a sixth input terminal, a fourth output terminal and a fifth output terminal, wherein the fifth input terminal is coupled to the second signal input terminal to receive the second input signal, and the fifth output terminal is coupled to the first terminal of the loading circuit;
a fourth cascode amplifier circuit, comprising a seventh input terminal, an eighth input terminal and a sixth output terminal, wherein the seventh input terminal is coupled to the fourth output terminal, and the sixth output terminal is coupled to the sixth input terminal and the second terminal of the loading circuit; and
a second capacitor, wherein two terminals of the second capacitor are respectively coupled to the eighth input terminal and the fourth output terminal.

8. The amplifier as claimed in claim 7, wherein the third cascode amplifier circuit comprises:
a seventh transistor, wherein a control terminal of the seventh transistor is coupled to the fifth input terminal, a first terminal of the seventh transistor receives a first reference voltage, and a second terminal of the seventh transistor is coupled to the fourth output terminal; and
an eighth transistor, wherein a control terminal of the eighth transistor is coupled to the sixth input terminal, a first terminal of the eighth transistor is coupled to the second terminal of the seventh transistor, and a second terminal of the eighth transistor is coupled to the fifth output terminal.

9. The amplifier as claimed in claim 7, wherein the fourth cascode amplifier circuit comprises:
a ninth transistor, wherein a control terminal of the ninth transistor is coupled to the seventh input terminal, and a first terminal of the ninth transistor receives a first reference voltage; and
a tenth transistor, wherein a control terminal of the tenth transistor is coupled to the eighth input terminal, a first terminal of the tenth transistor is coupled to a second terminal of the ninth transistor, and a second terminal of the tenth transistor is coupled to the sixth output terminal.

10. The amplifier as claimed in claim 7, further comprising:
a frequency band adjusting circuit, wherein a first terminal and a second terminal thereof are respectively coupled to the first terminal and the second terminal of the loading circuit to adjust a central frequency of the amplifier.

11. The amplifier as claimed in claim 10, the frequency band adjusting circuit comprising:
a third capacitor, wherein a first terminal thereof is coupled to the first terminal of the loading circuit;
a switch, wherein a first terminal thereof is coupled to a second terminal of the third capacitor; and
a fourth capacitor, wherein a first terminal thereof is coupled to a second terminal of the switch, and a second terminal of the fourth capacitor is coupled to the second terminal of the loading circuit.

* * * * *